United States Patent
Gohil et al.

(10) Patent No.: US 10,955,368 B2
(45) Date of Patent: Mar. 23, 2021

(54) METHOD AND DATA ANALYSIS SYSTEM FOR SEMI-AUTOMATED PARTICLE ANALYSIS USING A CHARGED PARTICLE BEAM

(71) Applicant: Carl Zeiss Microscopy Ltd., Cambridge (GB)

(72) Inventors: Champ Gohil, Cambridge (GB); Richard Moralee, Cambridge (GB)

(73) Assignee: Carl Zeiss Microscopy Ltd., Cambridge (GB)

( * ) Notice: Subject to any disclaimer, the term of this patent is extended or adjusted under 35 U.S.C. 154(b) by 1072 days.

(21) Appl. No.: 14/455,811

(22) Filed: Aug. 8, 2014

(65) Prior Publication Data
US 2015/0046097 A1 Feb. 12, 2015

(30) Foreign Application Priority Data
Aug. 9, 2013 (EP) .................................. 13003977

(51) Int. Cl.
*G01N 23/225* (2018.01)
*G06T 7/11* (2017.01)
(Continued)

(52) U.S. Cl.
CPC ....... *G01N 23/225* (2013.01); *G06F 3/04845* (2013.01); *G06T 7/0004* (2013.01);
(Continued)

(58) Field of Classification Search
CPC .... G01N 23/225; G06F 3/04845; H01J 37/28; G06T 7/0081; G06T 2207/10061; G06T 2207/20112; G06T 7/0004
See application file for complete search history.

(56) References Cited

U.S. PATENT DOCUMENTS

| 7,490,009 | B2 | 2/2009 | Gottlieb et al. |
| 9,098,912 | B2 | 8/2015 | Kriston et al. |

(Continued)

FOREIGN PATENT DOCUMENTS

| CN | 102072913 A | 5/2011 |
| CN | 102980902 A | 3/2013 |

(Continued)

OTHER PUBLICATIONS

Crawford et al., Analysis of lipid nanoparticles by Cryo-EM for characterizing siRNA delivery vehicles, 2011, International Journal of Phamaceutics, vol. 403, No. 1-2, pp. 237-244.*

(Continued)

*Primary Examiner* — Lisa E Peters
(74) *Attorney, Agent, or Firm* — Butzel Long

(57) ABSTRACT

A data analysis system is disclosed for generating analysis data depending on microscopic data of an object generated by a charged particle microscope. The microscopic data includes an image showing a structure. A graphical representation of the structure is displayed on the display by the graphical user interface. Separation data is generated representing at least one path of a separation cut, which separates pixels of the structure from each other. The separation cut is visually marked by the graphical user interface, depending on the separation data, by differently marking different area portions of the representation, which represent different pixels of the structure which are separated from each other by the separation cut. Separate analysis data are generated for each of at least two portions of the object, depending on the microscopic data and depending on the separation data.

9 Claims, 7 Drawing Sheets

(51) Int. Cl.
    H01J 37/28    (2006.01)
    G06T 7/00     (2017.01)
    G06F 3/0484   (2013.01)

(52) U.S. Cl.
    CPC ............ *G06T 7/11* (2017.01); *H01J 37/28* (2013.01); *G06T 2200/24* (2013.01); *G06T 2207/10061* (2013.01); *G06T 2207/20104* (2013.01); *G06T 2207/20112* (2013.01); *H01J 2237/225* (2013.01); *H01J 2237/2806* (2013.01); *H01J 2237/2807* (2013.01)

(56) References Cited

U.S. PATENT DOCUMENTS

| | | | |
|---|---|---|---|
| 2004/0197017 A1* | 10/2004 | Olschewski | G06T 7/0012 382/128 |
| 2006/0210129 A1 | 9/2006 | Trendelenburg et al. | |
| 2009/0314939 A1* | 12/2009 | Stern | G01N 1/34 250/309 |
| 2011/0031215 A1 | 2/2011 | Mantz et al. | |
| 2011/0144922 A1 | 6/2011 | Corbett et al. | |
| 2011/0194749 A1 | 8/2011 | Morris | |
| 2012/0074317 A1* | 3/2012 | Diemer | H01J 37/222 250/307 |
| 2012/0104250 A1 | 5/2012 | Bean et al. | |
| 2012/0163688 A1 | 6/2012 | Salazar-Tio | |
| 2013/0015351 A1* | 1/2013 | Kooijman | G01N 23/203 250/307 |
| 2013/0054153 A1 | 2/2013 | Motl et al. | |
| 2014/0117231 A1* | 5/2014 | Owen | H01J 37/28 250/307 |

FOREIGN PATENT DOCUMENTS

| | | |
|---|---|---|
| CN | 103210416 A | 7/2013 |
| EP | 2 282 197 A2 | 2/2011 |
| EP | 2 450 936 A1 | 5/2012 |
| EP | 2450936 * | 5/2012 |
| EP | 2 546 638 A2 | 1/2013 |

OTHER PUBLICATIONS

Jain et al., Machines that learn to segment images: a crucial technology for connectomics, 2010, Current Opinion of Neurobiology, vol. 20, No. 5, pp. 653-666.*

"Extended European Search Report dated May 11, 2015 from parallel European patent application No. 14 004 439.7".

R. Crawford et al., "Analysis of lipid nanoparticles by Cryo-EM for characterizing siRNA delivery vehicles", International Journal of Pharmaceutics, Elsevier, vol. 403, No. 1-2, 2011, pp. 237-244.

V. Jain et al., "Machines that learn to segment images: a crucial technology for connectomics", Current Opinion in Neurobiology, Elsevier, vol. 20, No. 5, 2010, pp. 653-666.

L.S. Karlsson et al., "'Size determination of Au aerosol nanoparticles by off-line TEM/STEM observations", Journal of Nanoparticle Research, Kluwer Academic Publishers, vol. 8, No. 6, 2006, pp. 971-980.

N. R. Voss et al., "DoG Picker and TiltPicker: Software tools to facilitate particle selection in single particle electron microscopy", Journal of Structural Biology, Academic Press, vol. 166, No. 2, 2009, pp. 205-213.

D. Sutherland et al., "Measurement in Section of Particles of Known Composition" Minerals Engineering, vol. 1, No. 4, 1988, pp. 317-326.

N. O. Lotter et al., "The development of process mineralogy at Falconbridge Limited and application to the Raglan Mill", Minceral Processing, CIM Bulletin, vol. 95, No. 1066, 2002, pp. 85-92.

A.R. Butcher et al., "Advances in the Quantification of Gold Deportment by QemSCAN", Seventh Mill Operators' Conference, Kalgoorlie, WA, 2000, pp. 267-271.

D. Pirrie et al., "'Rapid quantitative mineral and phase analysis using automated scannin electron microscopy (QemSCAN); potential applications in forensic geoscience", Forensic Geoscience: Principles, Techniques and Applications, Geological Society, London, Special Publications, vol. 232, 2004, pp. 123-136.

"SmartPI: The Complete Automated Particle Analysis Solution", Particle Analysis Software from Carl Zeiss, 2012 (see last page), pp. 1-4; http://application.zeiss.com/C125792900358A3F/0/46AD16D3D441669EC125795100478EF1/$FILE/EN_42_011_104_SmartPI_Flyer.pdf.

"ParticleSCAN VP: A New Dimension in Process Control", Particle Analysis and Process Control System from Carl Zeiss, 2012 (see last page), pp. 1-5; http://applications.zeiss.com/C125792900358A3F/0/B760D6B0FD185014C125795100478E77/$FILE/EN_42_011_103_ParticleSCAN_Brochure.pdf.

"Characterization of Oil Shale Rock for Compositional Analysis", White Paper from Carl Zeiss, 2013 (see last page), pp. 1-6; http://microscopy.zeiss.com/content/dam/Microscopy/US_Events/Trade%20Shows/AAPG/EN_42_011_038_characterization-oil-shale-rock_USformat.pdf.

Partial European Search Report dated Jan. 21, 2014 from parallel European patent application No. 13 003 977.9.

Extended European Search Report dated Apr. 22, 2014 from parallel European patent application No. 13 003 977.9.

The State Intellectual Property Office of the P.R.C., Office Action dated Nov. 1, 2018 in parallel Chinese patent application No. 201410392594.5, 21 pages, China.

* cited by examiner

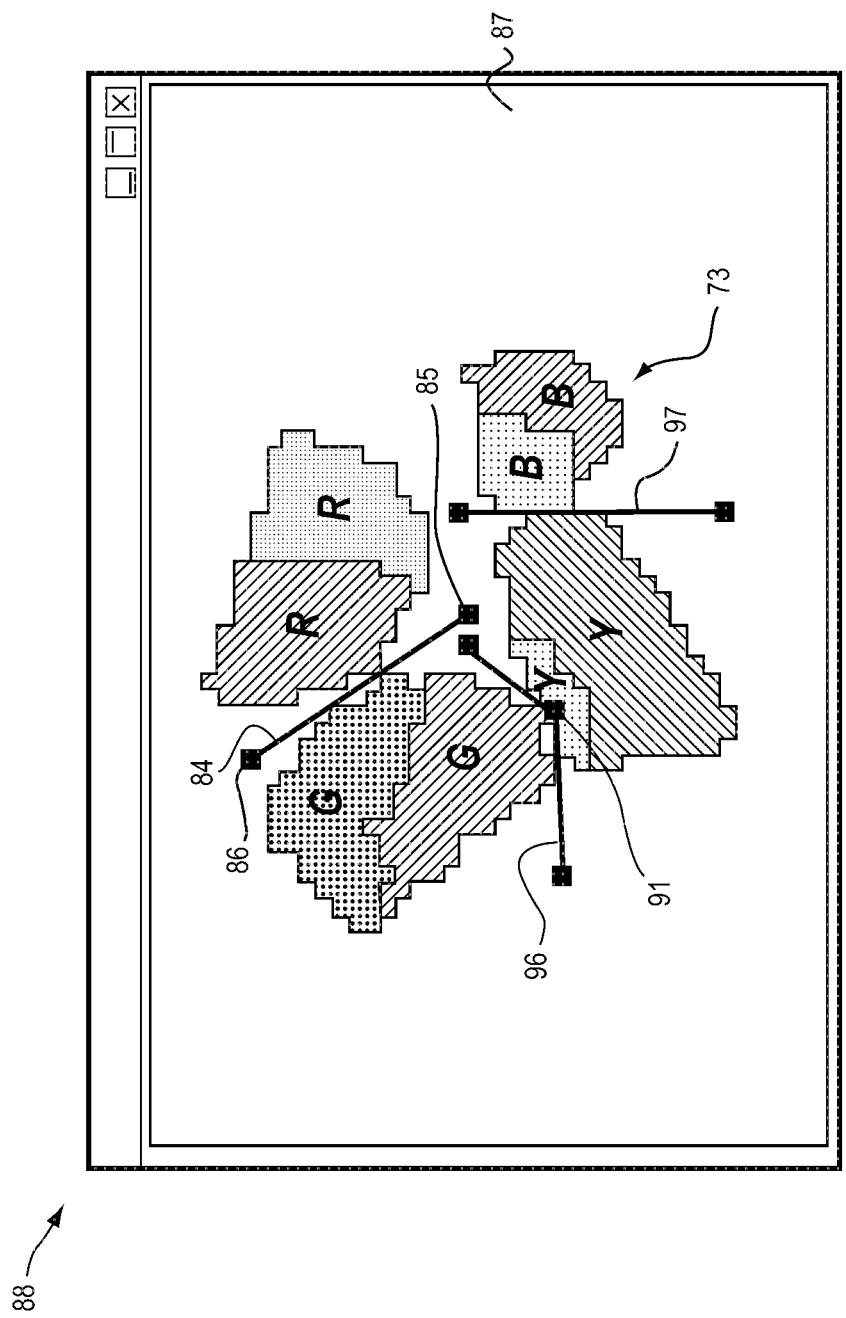

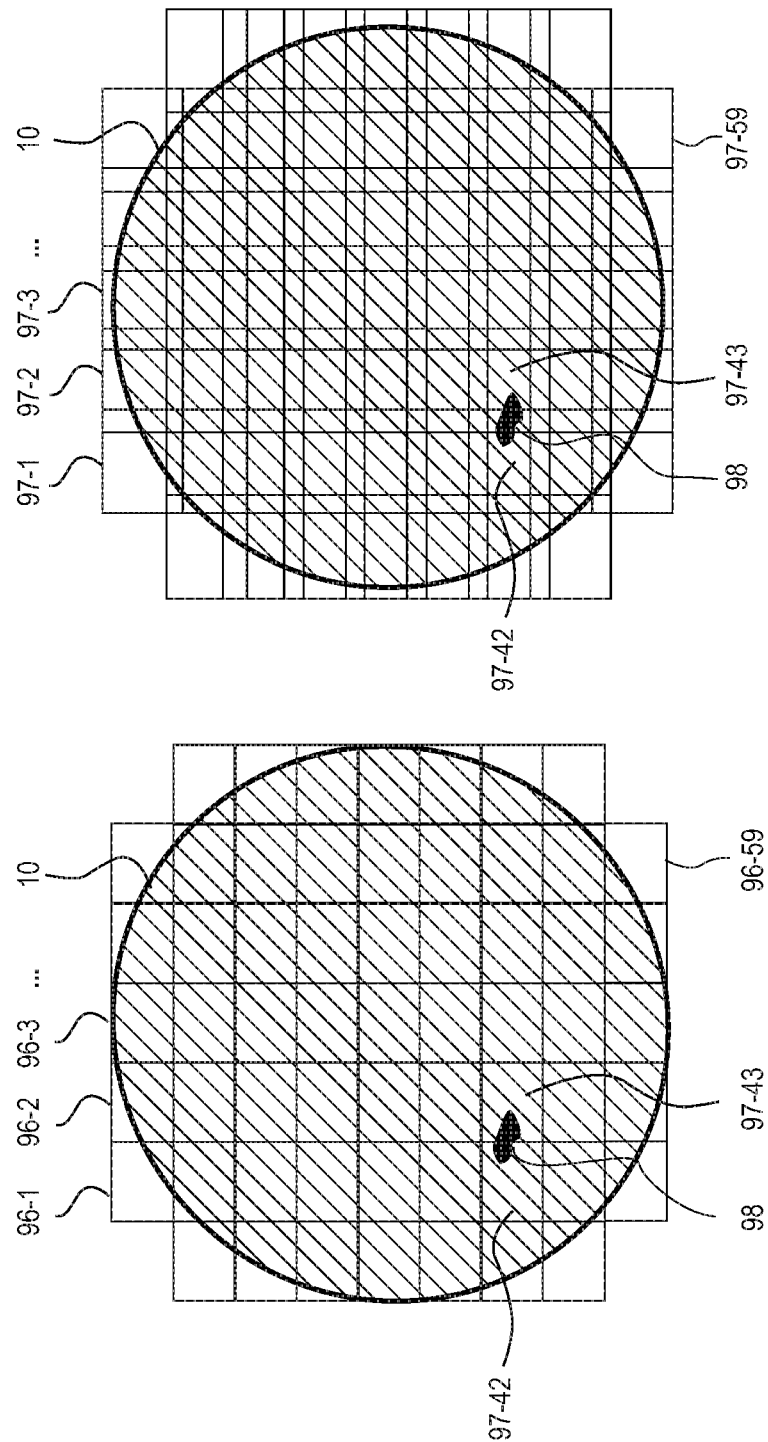

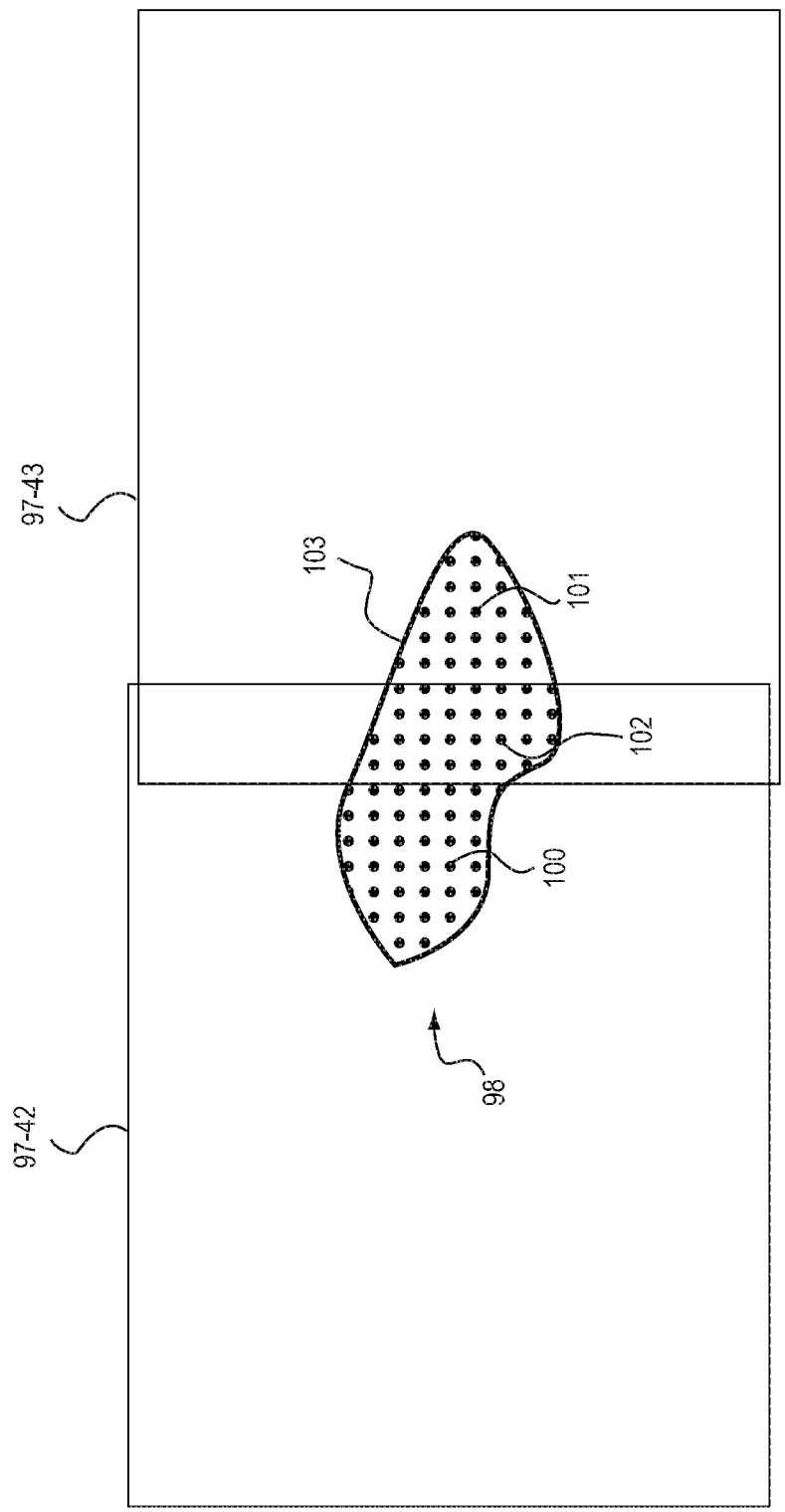

METHOD AND DATA ANALYSIS SYSTEM FOR SEMI-AUTOMATED PARTICLE ANALYSIS USING A CHARGED PARTICLE BEAM

CROSS-REFERENCES TO RELATED APPLICATIONS

The present application claims priority of European patent application No. 13 003 977.9, filed Aug. 9, 2013, the entire contents of which are incorporated by reference herein.

FIELD

The present invention relates generally to a data analysis system and a method for operating a data analysis system which is configured for automated or semi-automated data analysis of microscopic data generated by a charged particle microscope. More specifically, the invention is concerned with a data analysis system and a method for operating the data analysis system, which is configured to generate statistical data for a plurality of object particles.

BACKGROUND

There are SEM (scanning electron microscopy) systems known, which are equipped with an EDX (energy dispersive X-ray spectroscopy) system. The primary electron beam stimulates emission of characteristic X-rays from a specimen. The EDX system has an energy-dispersive spectrometer, which detects the number and energy of the X-rays. This allows elemental analysis or chemical characterization of the specimen.

Such SEM systems are widely used for particle mineral analysis. In a typical sample preparation techniques for particle mineral analysis the rock is disaggregated into its component grains, e.g. by crushing using a mortar and pestle. The sample grains are then mixed with graphite particles, which act as a separator for distinguishing individual particles. The mixture of sample grains and graphite is set in epoxy resin and polished. In an alternative sample preparation method, the sample grains are held on double-sided adhesive carbon tape. Then, the surface is coated with a carbon film to form a conductive coating to prevent electrical charging by the electron beam. The object is then inserted into the vacuum chamber of the SEM.

For obtaining accurate results of the particle mineral analysis, it is necessary to determine each individual particle in the SEM images. However, automatic detection of the individual particles is made difficult by the fact that some of the particles are touching each other or seem to touch each other as a result of the limited resolution of the microscopic image. Ignoring these effects lead to inaccurate results of the particle mineral analysis.

Therefore, a need exists to provide a method and a data analysis system, which allows to efficiently conduct a particle mineral analysis based on data of a charged particle microscope.

Embodiments provide a method of operating a data analysis system for generating analysis data depending on microscopic data of a charged particle microscope. The microscopic data comprises an image showing a structure representing a portion of an object. The data analysis system may comprise a graphical user interface and a display. The method may comprise displaying a graphical representation of the structure on the display by the graphical user interface. The method may further comprise generating separation data representing at least one path of a separation cut, which separates pixels of the structure from each other. The method may further comprise visually marking the separation cut by the graphical user interface, depending on the separation data, by differently marking different area portions of the representation, representing different pixels of the structure which are separated from each other by the separation cut. The method may further comprise generating separate analysis data for each of at least two portions of the object, depending on the microscopic data and depending on the separation data.

Accordingly, a method is provided, which allows to accurately cut apart structures of microscopic images of charged particle microscopes for later analysis. In particular, the visible marking of the separation cut makes it possible to accurately separate image structures, which represent a plurality of particles, into structures, which represent individual particles.

This allows to obtain accurate analysis data on a per particle basis. Thereby, reliable statistical data can be obtained when a plurality of particles are inspected. Thereby, the method can be advantageously applied for particle analysis in the fields of geoscience (such as environmental geoscience or forensic geoscience), archaeology, forensic analysis (such as analysis of gunshot residues or paint flakes), and analysis of airborne particulate materials. Further possible fields of application include inspection of tablet material in the pharmaceutical field, automotive parts cleanliness, wear debris characterization, bulk material inspection in the construction industry.

The charged particle microscope may be a scanning charged particle microscope. In particular, the charged particle microscope may be a scanning electron microscope (SEM) and/or a focused ion beam (FIB) microscope. The focused ion beam microscope may comprise a gas field ion source, a plasma ion source and/or a liquid metal ion source. By way of example, the focused ion beam microscope is a noble gas ion microscope or a helium ion microscope.

The image may be a scanned image. The image may be a two-dimensional array of adjacent pixels. The array may have a non-orthogonal or an orthogonal configuration, such as a square or rectangular configuration. The term "adjacent" may be defined to mean having a common boundary. Generating the microscopic data may include detecting intensities of charged particles, which are emitted from an interaction region where the primary beam of the charged particle microscope interacts with the object. The charged particles may be secondary electrons backscattered electrons, backscattered ions and/or secondary ions.

Additionally or alternatively, generating the microscopic data may include detecting X-ray intensities of X-rays, which are emitted from the interaction region. The detecting of the X-rays may comprise detecting X-ray spectra. The X-ray spectra may be detected by EDX (energy dispersive X-ray spectroscopy) and/or WDS (wavelength dispersive X-ray spectroscopy).

The data analysis system may be a computer system. The computer system may comprise one or a combination of the following components: a processor, a data storage device, an output device and/or an input device. The output device may be the display.

A "structure" may refer to a pixel region within the image. The structure may be a portion of the image. The structure may be determined by determining a pixel region, which corresponds to one or more particles of the object. The structure may be determined depending on pixel data values of the image. The pixel data values may be determined depending on detected primary particles of the primary beam, such as backscattered electrons. The structure may be detected by using an image processing algorithm, such as an edge detection filter. The structure may have one or more edges which are defined by the pixel data values of the image. A spatial extent and/or a shape of the structure may be defined by the one or more edges. The structure may be surrounded by the one or more edges. The structure may be determined by applying an edge detection filter to the image. By way of example, the structure may be formed by a plurality of pixels of the image, wherein the plurality of pixels represent one or more particles of the object. The structure may represent one or more particles of the object.

The particles of the object may be mineral particles and/or organic particles. Each of the particles may consist of one or more grains. The term grain may be defined to refer to a mineral grain or to a monomineral grain. Two or more particles of the structure may touch each other and/or may have a separation distance, which is not resolved by the microscopic image. The structure may be a non-divided image region. In other words, each pair of pixels of the structure may be either adjacent to each other or connected to each other by a series of adjacent pixels, wherein each of the series of adjacent pixels form part of the structure. The term "adjacent" may be defined to mean having a common boundary. In still other words, the structure may be configured such that it does not have a plurality of mutually isolated pixel clusters.

For each of the particles, a maximum diameter of the respective particle may be within a range of between 50 nanometers and 500 micrometers, or within a range of between 0.5 micrometers and 100 micrometers. It is also conceivable that a single object is inspected by dividing the object into single structures. The object portion, which corresponds to the structure may then have a maximum diameter, which is within the ranges above.

The graphical representation may be generated depending on the microscopic data. The graphical representation may indicate the one or more edges, which define the structure. A spatial extent and/or a shape of the graphical representation may represent and/or correspond to a spatial extent and/or a shape of the structure.

The separation cut may cut the structure of the image into at least two separated structure portions. Each of the separated structure portions may represent one or more individual particles of the object.

The method may further comprise determining at least two object portions depending on the separation data. The object portions may correspond to the structure portions of the image, which are generated by the separation cut. Accordingly, each of the object portions may represent one or more individual particles.

For each of the object portions, separate analysis data are generated. The separate analysis data may represent physical and/or chemical attributes of the object portion. Such attributes may include one or a combination of the following parameters: size and weight of the object portion, chemical composition, number and class of mineral grains contained in the object portion, as well as the area weight and grain size of each of the grains.

The path of the separation cut may be continuous or discontinuous. The path of the separation cut may comprise one or more linear and/or curved path segments. The path may be branched or unbranched.

The separation data may be generated automatically and/or interactively. In this context, the term interactively may be defined to mean that the step of generating the separation data depends on user input. The user input may be received via the graphical user interface.

By way of example, the user input may include generating and/or adapting an indicator for the path of the separation cut on the display. The indicator may be generatable and/or adaptable via the graphical user interface. The indicator may be generated and/or adapted by using an input device, such as a mouse.

The area portions of the graphical representation of the structure may be differently marked by marking the different area portions in different colors or different color hues. The different colors may differ from each other in one or more coordinate values of a multi-dimensional color coordinate system. By way of example, the color coordinate system is a tri-chromatic system (such as RGB), a brightness/bi-chromatic system (such as YCbCr, YUV, etc.), or a brightness, saturation, and hue system (such as HSV).

According to an embodiment, the method further comprises: updating the marking of the separation cut by the graphical user interface in response to a change of the separation data. Changing the separation data may comprise receiving user input. The user input may be received via an input device and/or the graphical user interface.

According to a further embodiment, the separation data is configured such that the structure is seamlessly cut apart by the separation cut.

Accordingly, it is possible to cut the structure apart without discarding pixels, which represent information. Thereby, the accuracy of the analysis of the object is increased.

The term "seamlessly cut apart" may be defined to mean that the structure comprises adjacent pixels, which are separated from each other by the separation cut. The separation data may be configured such that the path of the separation cut is infinitesimally thin.

The data analysis system may be configured to determine for each pixel of the structure a position of a midpoint of the respective pixel relative to the path of the separation cut and/or relative to further midpoints of pixels of the structure. The midpoint may be infinitesimally small. Depending on the determined position of the midpoint, the data analysis system may determine, which pixels are separated from each other by the separation cut. By way of example, the data analysis system may be configured to determine whether or not a connecting line between two midpoints crosses the path of the separation cut. If the connecting line crosses the path of the separation cut, the pixels, which correspond to the two midpoints are separated by the separation cut. If the connecting line does not cross the path of the separation cut, the pixels, which correspond to the midpoints, are not separated by the separation cut. The connecting line may be a straight connecting line.

When the path of the separation cut is an infinitesimally thin line, there are only few pixels, which midpoints are located exactly on the path of the separation cut. These pixels may be marked by the data analysis system, such that the user can assign them to one of the separated portions of the structure. Alternatively, the data analysis system may decide, to which of the separated structure portions these pixels are to be assigned. This decision may depend on a result of an image processing routine. Alternatively, the data processing system may be configured to exclude these pixels from the generation of the analysis data.

According to a further embodiment, the marking of the separation cut is executed by the graphical user interface in time relation or in real-time relation to the generating of the separation data.

Accordingly, it is possible for the operator to see, how the separation path separates the structure. This allows the operator to iteratively change the separation data. The time relation may be a real-time relation or substantially a real-time relation. The time relation may be configured such that a time interval between the generation of the separation data and the marking of the separation cut is less than 2 seconds or less than 1 second or less than 0.5 second.

According to a further embodiment, the method further comprises generating X-ray intensity data by detecting X-rays emitted from each of a plurality of impingement locations of a primary beam of the charged particle microscope on the object. The marking of the separation may further comprise visibly marking the different portions of the representation depending on the generated X-ray intensity data.

Accordingly, it is possible for the operator to generate the separation data such that a more accurate analysis of the microscopic data can be achieved.

The impingement locations may be located within the portion of the object, which is represented by the structure. The X-ray intensity data may comprise data generated by an EDX and/or a WDS detector. The X-ray intensity data may comprise a spectrum and/or measurements at one or more selected X-ray wavelengths.

According to an embodiment, the method may further comprise assigning each of the impingement locations of the primary beam to one of a plurality of pre-defined classes depending on the generated X-ray intensity data of the respective impingement location. The marking of the separation may further comprise visibly marking the pixels depending on the assigned pre-defined classes.

The pre-defined classes may represent a mineral or a group of minerals. By way of example, the classes may be defined by ranges of elemental composition, elemental ratios and/or mathematical operations applied to the elemental composition.

According to a further embodiment, the marking of the separation further comprises displaying, by the graphical user interface, a separation indicator representing the path of the separation cut. The separation indicator may be displayed on the display.

The separation indicator may comprise a line or a plurality of line segments. The line segments may be curved or linear. The separation indicator may be branched or unbranched.

According to a further embodiment, the separation indicator has one or more position adjustable anchor points. The position of the anchor points may be adjustable depending on user input. The position of the one or more anchor points may define a course of the separation indicator.

This allows the user to accurately define the course of the separation indicator relative to the representation of the structure, which is to be separated.

An anchor point may be defined as a point, which is located at one or both ends of a line or line segment. The anchor point may connect two line segments. The anchor point is position adjustable. In other words, the graphical user interface is configured to adjust the position of the anchor point depending on user input. The anchor point may be positionable by using the pointer of the mouse.

Accordingly, by positioning the anchor points relative to the graphical representation of the structure, the user can adjust the course of the indicator for the path of the separation cut.

According to an embodiment, the generating of the separation data comprises adjusting a course of the path of the separation cut by adjusting a course of the separation indicator. The course of the separation indicator may be adjustable via the graphical user interface. The course of the separation indicator may be adjusted by adjusting the position of one or more anchor points on the display.

Embodiments provide a data analysis system for generating analysis data depending on microscopic data of an object generated by a charged particle microscope. The microscopic data may comprise an image showing a structure. The data analysis system may comprise a graphical user interface and a display. The data analysis system may be configured to display a graphical representation of the structure on the display by the graphical user interface. The data analysis system may further be configured to generate separation data representing at least one path of a separation cut, which separates pixels of the structure from each other. The data analysis system may further be configured to visually mark the separation cut by the graphical user interface, depending on the separation data, by differently marking different portions of the representation, representing different pixels of the structure which are separated from each other by the separation cut. The data analysis system may further be configured to generate separate analysis data for each of at least two portions of the object, depending on the microscopic data and depending on the separation data.

Embodiments provide a method of operating a data analysis system for analyzing microscopic data acquired by a charged particle microscope from an object comprising a plurality of sample particles. The microscopic data comprises X-ray intensity measurement data and charged particle intensity measurement data, which have been acquired by scanning a primary beam of the charged particle microscope in a first and a second scanning region. The first and the second scanning regions may be adjacent to each other or partially overlapping with each other. The method may comprise identifying at least one sample particle of the plurality of sample particles, which is at least partially located in the first and in the second scanning region. The method may further comprise generating X-ray intensity data assigned to surface locations of the identified sample particle, depending on at least a portion of the X-ray intensity measurement data of the first scanning region, at least a portion of the X-ray intensity measurement data of the second scanning region, and further depending on at least a portion of the particle intensity measurement data, which have been acquired from the first and the second scanning regions. The X-ray intensity data assigned to the surface locations may be generated depending on at least a portion of the particle intensity measurement data of the first scanning region and/or depending on at least a portion of the particle intensity measurement data of the second scanning region.

The scanning regions may be portions of the object surface. The X-ray intensity measurement data and/or the X-ray intensity data may be wavelength specific. The X-ray intensity measurement data and/or the X-ray intensity data may comprise X-ray spectra for a range of wavelengths. Each of the spectra may have been acquired at a location on the object surface, such as an impingement location of the primary beam or a surface location of the identified particle to which the generated X-ray intensity data has been assigned. The X-ray intensity data may include data of EDX and/or WDS measurements at one or more locations on the object surface. The charged particle intensity measurement data may be measured by detecting secondary electrons backscattered electrons, backscattered ions and/or secondary ions.

According to a further embodiment, each of the surface locations of the identified particle are located in the first and/or in the second scanning region. Thereby, the generated X-ray data which are assigned to the surface locations of the identified particle may depend on the X-ray intensity measurement data of the first and the second scanning regions.

According to a further embodiment, the generating of the assigned X-ray intensity data comprises generating, for each of the first and second scanning regions, an image depending on the particle intensity measurement data of the respective scanning region. An image may be defined as a two-dimensional array of adjacent pixels. The array may have a non-orthogonal or an orthogonal configuration The method may further comprise generating the assigned X-ray intensity data depending on the images of the first and the second scanning regions. The image of the first scanning region and/or the second scanning region may further be determined depending on the X-ray intensity measurement data of the respective scanning region. The generating of the assigned X-ray intensity data may comprise aligning and/or stitching the images of the first and the second scanning regions. The generating of the assigned X-ray intensity data may comprise forming a composite image, which includes the images of the first and the second scanning regions.

According to a further embodiment, the generating the assigned X-ray intensity data comprises comparing the image of the first scanning region with the image of the second scanning region.

According to a further embodiment, the generating the assigned X-ray intensity data and/or the comparing the image of the first scanning region with the image of the second scanning region comprises applying an image processing procedure. The image processing procedure may be applied to the image of the first scanning region and/or to the image of the second scanning region. The image processing procedure may include aligning and/or stitching the image of the first scanning region and the image of the second scanning region.

According to a further embodiment, the generating the assigned X-ray intensity data comprises determining a position and an/or an orientation of the image of the first scanning region relative to the image of the second scanning region.

Depending on the image processing procedure and/or depending on the determined position and/or orientation of the image of the first scanning region relative to the image of the second scanning region, a composite image may be formed, which includes the image of the first scanning region and the image of the second scanning region.

According to a further embodiment, the generating of the assigned X-ray intensity data further comprises determining positions of impingement locations of the primary beam in the first and in the second scanning region relative to each other, wherein at the impingement locations, the portions of the X-ray intensity measurement data of the first and second scanning regions have been acquired. Thereby, the positions of the impingement locations of the primary beam in the first scanning region may be determined relative to the positions of the impingement locations of the primary beam in the second scanning region. At least a portion of the impingement locations may be located in a non-overlapping region of the first scanning region and/or in a non-overlapping region of the second scanning region. In the non-overlapping region, the scanning region does not overlap with the other scanning region.

According to a further embodiment, the determining of the positions of the impingement locations relative to each other comprises comparing the image of the first scanning region with the image of the second scanning region. According to a further embodiment, the determining of the positions of the impingement locations relative to each other comprises applying an image processing procedure. The image processing procedure may include aligning and/or stitching.

According to a further embodiment, the determining of the positions of the impingement locations relative to each other is performed depending on the images of the first and the second scanning region. According to a further embodiment, the determining of the positions of the impingement locations relative to each other comprises determining a position and/or an orientation of the image of the first scanning region relative to an image of the second scanning region.

According to a further embodiment, the generating of the assigned X-ray intensity data comprises: generating, for each of the first and second scanning regions, an image depending on the particle intensity measurement data of the respective scanning region; and determining positions of impingement locations of the primary beam in the first and in the second scanning region relative to each other; wherein at the impingement locations, the portions of the X-ray intensity measurement data of the first and second scanning regions have been acquired; wherein the determining of the impingement locations relative to each other is performed depending on the image of the first scanning region and the image of the second scanning region.

Since the positions of the impingement locations relative to each other are determined, the X-ray intensity data can be assigned to the surface locations with a high positional accuracy. The surface locations of the identified particle to which the X-ray intensity data are assigned may be identical or substantially identical to the impingement locations.

According to a further embodiment, the assigned X-ray intensity data comprises an X-ray spectrum. The X-ray spectrum may be generated depending on data of the X-ray intensity measurement data of the first scanning region and depending on data of X-ray intensity measurement data of the second scanning region. The X-ray spectrum may be a combined spectrum generated depending on X-ray spectra of the first and the second scanning regions.

Embodiments provide a data analysis system for analyzing microscopic data acquired by a charged particle microscope from an object comprising a plurality of sample particles. The microscopic data may comprise X-ray intensity measurement data and charged particle intensity measurement data, which have been acquired by scanning a primary beam of the charged particle in a first and a second scanning region. The first and the second scanning regions may be adjacent to each other or partially overlapping with each other. The data analysis system may be configured to identify at least one sample particle of the plurality of sample particles, which is at least partially located in the first and in the second scanning region. The data analysis system may be further configured to generate X-ray intensity data assigned to surface locations on a surface of the identified sample particle, depending on at least a portion of the X-ray intensity data of the first scanning region, at least a portion of the X-ray intensity data of the second scanning region, and further depending on at least a portion of the particle intensity data, which have been acquired from the first and the second scanning regions.

Embodiments provide a non-transitory computer-readable storage medium storing instructions that, when executed by a computer, cause the computer to perform the method of any one of the preceding embodiments.

BRIEF DESCRIPTION OF THE DRAWINGS

The foregoing as well as other advantageous features will be more apparent from the following detailed description of exemplary embodiments with reference to the accompanying drawings. It is noted that not all possible embodiments necessarily exhibit each and every, or any, of the advantages identified herein.

FIGS. 4 and 5 schematically illustrate the generation of separation data by using the graphical user interface of the data analysis system according to the exemplary embodiment; and FIGS. 6A, 6B and 7 schematically illustrate the data analysis of the data analysis system according to the exemplary embodiment.

DETAILED DESCRIPTION OF EXEMPLARY EMBODIMENTS

While the disclosure has been described with respect to certain exemplary embodiments thereof, it is evident that many alternatives, modifications and variations will be apparent to those skilled in the art. Accordingly, the exemplary embodiments of the disclosure set forth herein are intended to be illustrative and not limiting in any way. Various changes may be made without departing from the spirit and scope of the present disclosure.

Figure 1:
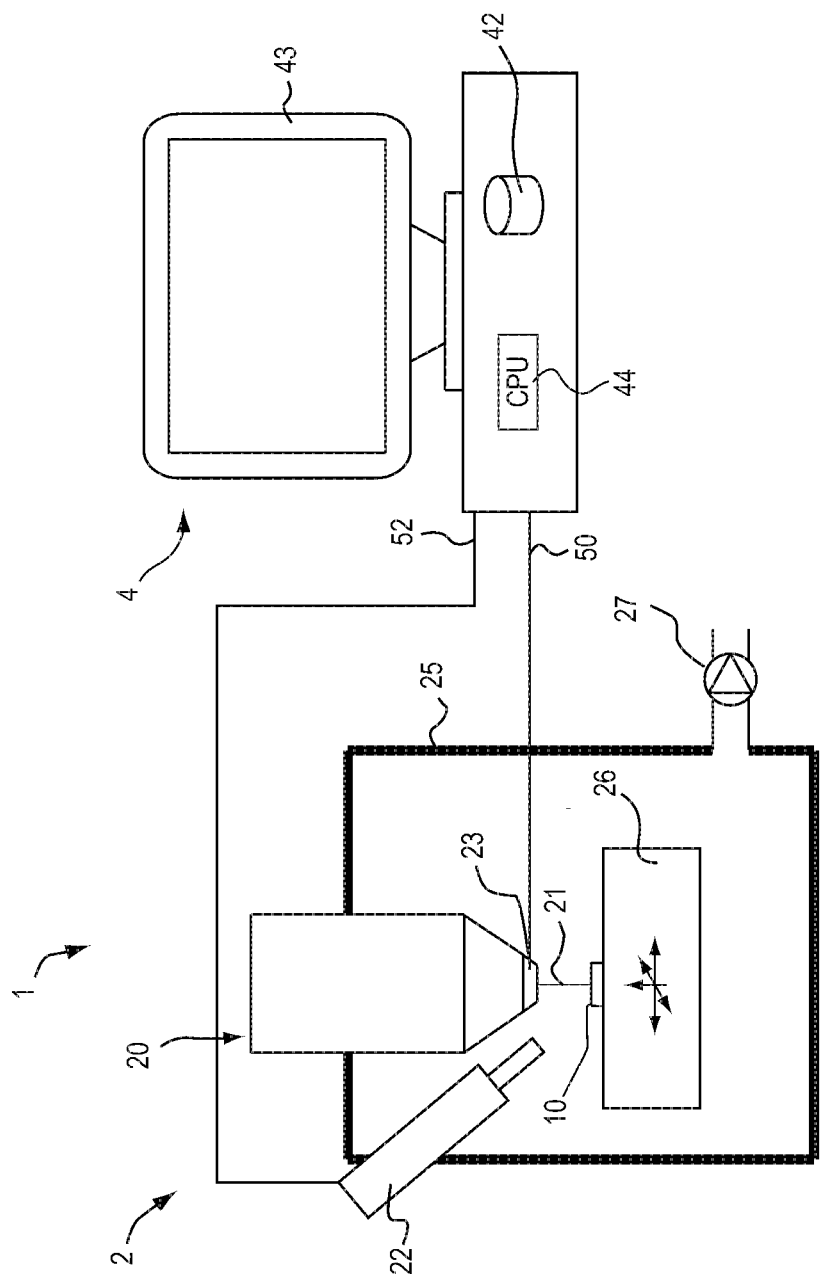
FIG. 1 schematically illustrates a charged particle microscope. The charged particle microscope is in signal communication with a data analysis system, which is configured according to an exemplary embodiment.

FIG. 1 illustrates a data analysis system 4 for generating analysis data from microscopic data of a charged particle microscope 2 according to an exemplary embodiment. The data analysis system and the charged particle microscope form an analysis system 1. In the exemplary embodiment, shown in FIG. 1, the charged particle microscope 2 is a scanning electron microscope. The scanning electron microscope 2 comprises a particle optical system 20 for scanning a focused electron beam 21 across a surface of an object 10, which is disposed in a vacuum chamber 25. Accordingly, the focused electron beam 21 represents the primary beam of the scanning electron microscope. The vacuum chamber 25 is equipped with a vacuum pumping system 27 for maintaining a pre-determined vacuum pressure during measurements with the focused electron beam 21.

The object 10 is mounted on a positioning system 26. The positioning system 26 is disposed within the vacuum chamber 25 and configured to position the object 10 relative to the particle optical system 20 such that a region of interest on the object surface is scannable by the electron beam 21.

The scanning electron microscope 2 is equipped with a backscattered electron detector 23 (also denoted as BSE detector). The BSE detector 23 is in signal communication with the data analysis system 4 via signal line 50. The data analysis system 4 is configured to read detector signals of the BSE detector 23 and to generate image data depending on the signals of the BSE detector 23.

The scanning electron microscope 2 is further equipped with an energy-dispersive spectrometer 22 (EDX detector). When the electron beam 21 removes an inner shell electron from an atom of the object 10, characteristic X-rays are emitted when higher energy electrons fill the inner shell of the atom and release energy. The EDX detector 22 is configured to detect intensities of these characteristic X-rays, resulting in an X-ray spectrum. The X-ray spectrum can be used to identify the elemental composition of an interaction region where the electron beam 21 interacts with the object 10. This allows to measure the abundance of specific elements at the impingement location of the electron beam 21.

The EDX detector 22 is in signal communication with the data analysis system 4 via signal line 52. The data analysis system 4 is configured to read detector signals of the EDX detector 22 and to generate X-ray spectra depending on the signals of the EDX detector 22.

In the exemplary embodiment, which is illustrated in FIG. 1, the data analysis system 4 includes a computer system, which comprises a display 43, a storage system 42, and one or more processors 44. The storage system 42 may comprise internal and/or external storage units. An external storage unit may be for example a network drive or a cloud storage unit. The data analysis system 4 further comprises a graphical user interface that resides in the storage system 42.

The data analysis system 4 is configured to efficiently generate separate analysis data for each of a plurality of particles of a surface of the object 10. This allows to obtain statistical data on the plurality of particles.

The inspection routines of the data analysis system can be advantageously applied in the field of geoscience (such as environmental geoscience and forensic geoscience), archaeology, forensic analysis (such as analysis of gunshot residues or paint flakes), and analysis of airborne particulate materials. Further possible fields of application include inspection of tablet material in the pharmaceutical field, automotive parts cleanliness, wear debris characterization, bulk material inspection in the construction industry.

Figure 2:
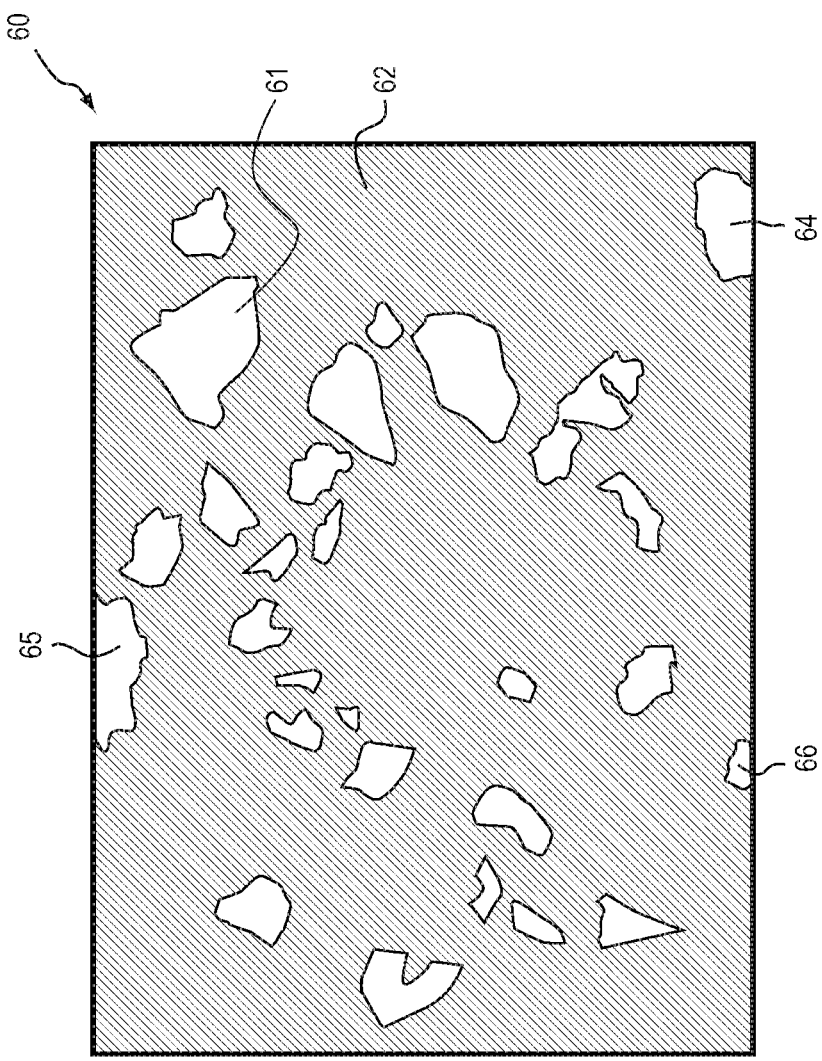
FIG. 2 schematically illustrates a backscattered electron image, which has been acquired by using the charge particle microscope shown in FIG. 1.

FIG. 2 illustrates an image of a plurality of particles, which has been generated by the data analysis system 4 depending on BSE detector signals. The image shows the particles of the object surface surrounded by a dark background.

In an exemplary sample preparation technique, the particles are generated by crushing a rock using a mortar and pestle. The rock particles are then mixed with graphite particles, which act as a separator for distinguishing the individual particles with the charged particle microscope 2. The mixture of particles and graphite is set in epoxy resin, polished and coated with carbon to form a conductive coating. The conductive coating prevents electrical charging by the electron beam 21 (shown in FIG. 1).

The object is then introduced into the vacuum chamber 25 (shown in FIG. 1) of the scanning electron microscope and imaged using the BSE detector. The carbon between the particles moderates backscatter, since it has a low atomic number, compared to the major constituents of the rock particles. Accordingly, as illustrated in FIG. 2, the rock particles are imaged as bright regions, such as region 61, surrounded by a darker background 62. The darker background 62 indicates those portions of the object surface, where only carbon is present.

In order to determine those image regions, where particles are present, the data analysis system applies a threshold filter to the image, shown in FIG. 2. The threshold may be selected such that pixel data values of the darker background, where only carbon is present, are filtered out.

After application of the threshold filter, the data analysis system 4 (shown in FIG. 1) determines structures, which are formed by single undivided image regions of pixels. Accordingly, the pixel data values of the pixels of the structure exceed the threshold value.

The undivided image regions are either formed by a single particle or by a group of particles. The group of particles is formed from individual particles, which either touch each other and/or which have a distance from each other which is not resolved by the BSE image.

For determining the undivided image regions, the data analysis system 4 may additionally or alternatively perform a segmentation of the image. The segmentation may comprise one or a combination of the following segmentation methods: a pixel-oriented method, an edge-oriented method, a region-oriented method, and a model-based method.

After the structures have been identified, EDX and/or WDS measurements are performed by detecting a spectrum of X-ray intensities at each of a plurality of impingement locations of the primary beam within each of the determined structures.

The data analysis system comprises a data base having pre-defined classes stored therein for assigning the detected X-ray spectra to one or more of the classes. Each of the class represents a mineral or a group of minerals. The pre-defined classes comprise a class designated "unclassified", which covers X-ray spectra, which either do not represent a mineral or which represent a mineral, which is not to be covered in the analysis.

Depending on the assigned X-ray spectra, the data analysis system is configured to identify in each of the structures, regions, which represent grains of minerals or a group of minerals.

Figure 3:
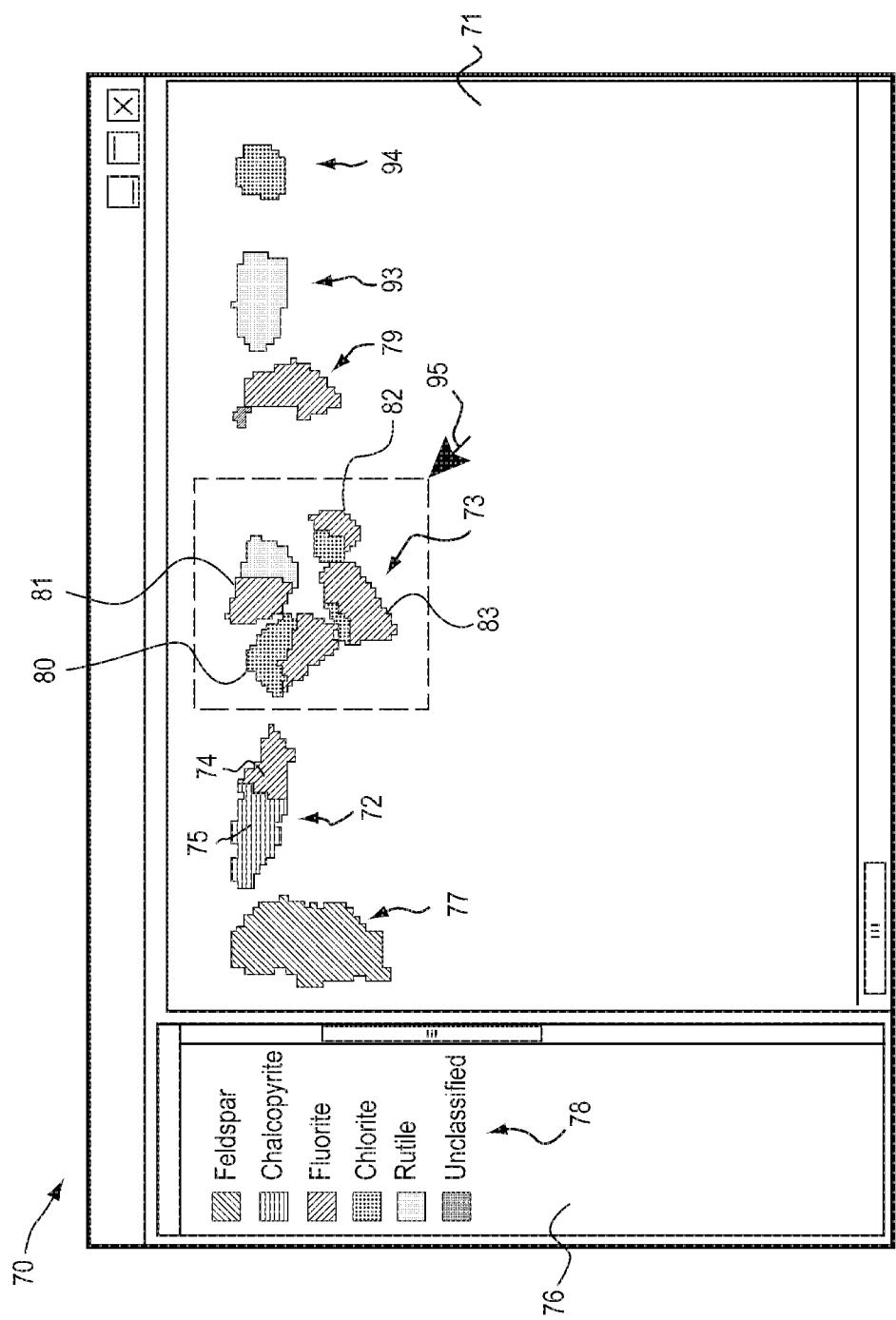
FIG. 3 schematically illustrates the operation of the graphical user interface of the data analysis system according to the exemplary embodiment.

FIG. 3 illustrates how the data analysis system 4 presents the analysis results to the user via the graphical user interface. The graphical user interface displays on the display a window 70. The window 70 comprises a rendering space 71, within which graphical representations 77, 72, 73, 79, 93, 94 of the structures, determined in the BSE image, are presented. Each of the graphical representation 77, 72, 73, 79, 93, 94 represents an individual particle or a group of individual particles. The graphical representations 77, 72, 73, 79, 93, 94 are presented in the rendering space 71 in one or more lines in order to allow the operator to sequentially screen the representations.

Where particles, are composed of more than one grain, the graphical representation shows subregions, wherein each of the subregion indicates the geometry of the respective grain. In FIG. 3, this is for example illustrated by the graphical representation 72, which is formed from subregions 75 and 74. Hence, the graphical representation 72 represents a particle, which is composed of two grains.

Each of the subregions 75, 74 is displayed in a color, which indicates the mineral or the group of minerals, of the respective grain. A list 78, which maps each of the colors to a name of a mineral or a group of minerals is presented to the user in a separate pane 76 of the window 70.

The stepped boundaries of the representations and the subregions, as shown in FIG. 3, indicate the sampling distance of the EDX measurements. The sampling distance may be defined as the distance between adjacent impingement locations of the primary beam, where X-ray spectra are acquired.

The graphical representation 73 represents a structure, which is most likely composed of a plurality of particles 80, 81, 82, 83 as can be recognized by the trained eye of the operator.

The data analysis system is configured such that the structure 73 is separable into structure portions, representing a single particle, based on user input. As is illustrated in FIG. 3, the operator can select the representation 73, for example, by drawing a rectangle around the representation 73 by using the pointer 95 of the mouse or by clicking on the representation 73 with the mouse. The representation 73 may be highlighted by the graphical user interface, when the pointer 95 of the mouse is positioned on the representation.

After the operator has selected the graphical representation 73, the graphical user interface displays in a rendering space 87 of a second window 88 the representation 73 of the structure 73 in an enlarged mode. This is schematically illustrated in FIG. 4.

The graphical user interface is configured to display, depending on user input, a line 84, which is an indicator for a path of a separation cut for separating the structure, which is represented by the graphical representation 73. At each end of the line 84, there is provided a position adjustable anchor point 85, 86. The graphical user interface is configured such that, by using the pointer of the mouse, the operator can adjust the position of each of the anchor points 85, 86 in the rendering space 87 relative to the graphical representation 73. This allows the operator to adjust the course of the separation cut.

The data analysis system is configured such that in response to the generation of the line 84, portions of the representation 73, which are separated by the separation cut, are differently marked.

Figure 4:
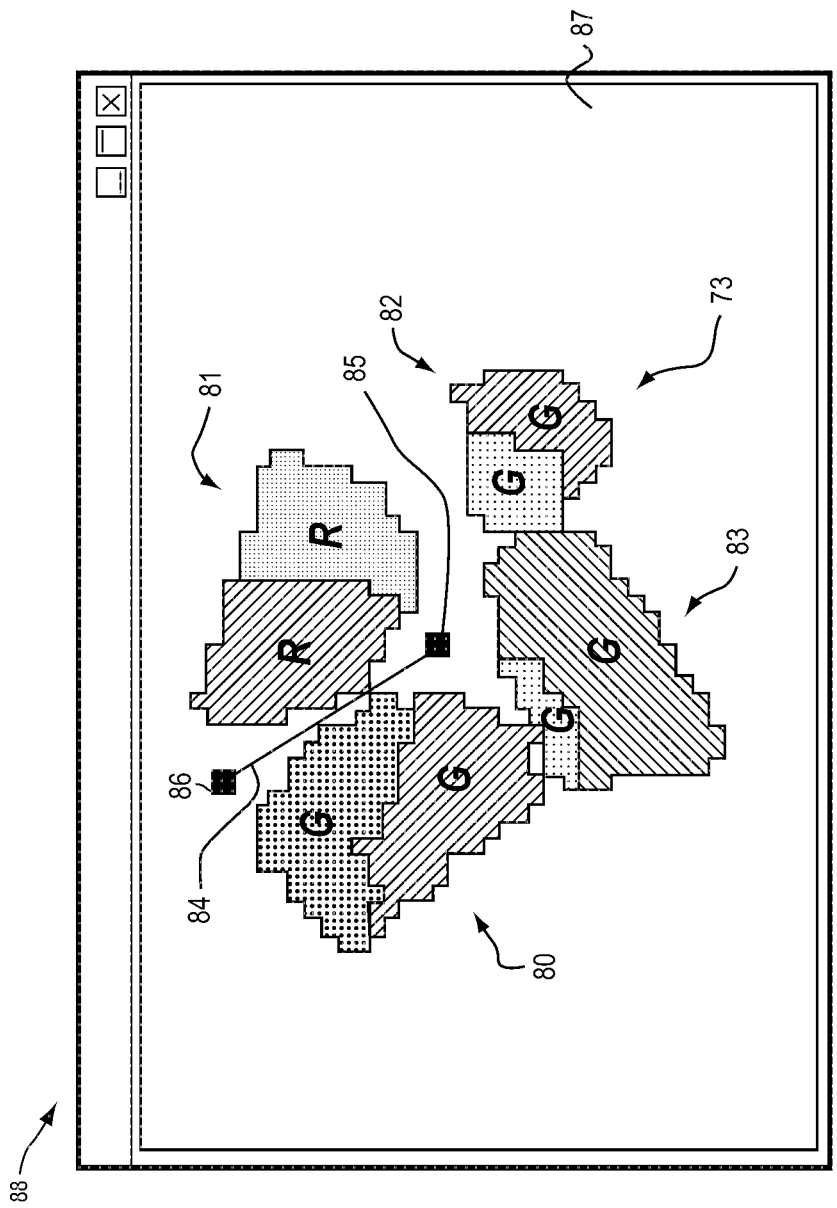

In the exemplary embodiment, illustrated in FIG. 4, portions of the representation 73, which are separated from each other are marked with different hues. In FIG. 4, this is indicated by letters R and G. The letter R indicates the portion of the representation, which is displayed in a red hue. The letter G indicates the portion, which is displayed in a green hue.

Inside each of the portions, areas, which correspond to different grains are marked with different values of other parameters of color appearance, such as colorfulness, chroma, saturation, lightness, and brightness. In FIG. 4, this is illustrated by differently hatched or dotted regions.

This allows the operator to more finely adjust the line 84 to accurately separate the structure.

The data analysis system is further configured to differently mark the portions of the representation 73, which are separated from each other, in real-time relation to the course of the line 84.

This allows the operator to iteratively adjust the position and/or orientation of the line 84 such that the separation cut accurately separates the structure into regions, which represent single particles.

The data analysis system is configured to generate depending on the position and/or orientation of the line 84, separation data, which defines the separation of the structure, which is represented by the representation 73.

The separation data are configured such that the structure is seamlessly cut apart by the separation cut. Accordingly, it is possible to cut the structure apart without discarding pixels, which represent information. Thereby, the accuracy of the analysis of the object is increased.

The term seamlessly cut apart may be defined to mean that the structure comprises adjacent pixels, which are separated from each other by the separation cut. The separation data may be configured such that the path of the separation cut is infinitesimally thin.

The data analysis system is configured to determine for each pixel of the structure a position of a midpoint of the respective pixel relative to the path of the separation cut. Depending on the determined position of the midpoint, the data analysis system may determine, which pixels are separated from each other by the separation cut.

FIG. 5, illustrates a plurality of lines 84, 96, 97, each of which representing a dissection indicator, which have been generated by the operator to separate the structure, which is represented by representation 73 into four regions, each of which representing a single particle. The graphical user interface is configured to allow the user to generate kinked dissection indicators, such as line 96. This provides the user with more flexibility to accurately cut the structure apart. The graphical user interface is further configured to provide a user-positionable anchor point 91 at the location of the kink and at the end of each of the lines 84, 96, 97.

As is illustrated in FIG. 5, the data analysis system differently marks pixels, which are separated from each other by the paths of dissection defined by lines 84, 96, 97. The letter R in FIG. 5 indicates those pixels, which are displayed in a red hue. The letter G in FIG. 5 indicates those pixels, which are marked in a green hue. The letter Y in FIG. 5 indicates those pixels, which are marked in a yellow hue and the letter B indicates those pixels, which are marked in a blue hue.

Thereby, the operator has cut apart the structure into four regions, each of which representing a single particle. After the operator has committed to the change, the data analysis system generates analysis data on the plurality of particles, which have been identified. For each mineral or group of minerals, one or a combination of the following data may be obtained: number of particles which contain grains of the respective mineral or the respective group of minerals, area %, weight %, mean grain size (measured in units of length), grain size standard deviation, assays, distributions, average composition, mode of liberation, cumulative liberation index.

FIGS. 6A and 6B illustrate two imaging modes for acquiring microscopic data of an object by using the charged particle microscope. The object is prepared by setting a mixture of rock particles and graphite in epoxy resin, polishing the object surface and coating the object surface with carbon. The object is then introduced into the vacuum chamber 25 (shown in FIG. 1) for inspection. FIGS. 6A and 6B show the object 10 in top view. The object 10 may have a diameter of between 1 and 50 millimeters or between 1 and 70 millimeters. The object may include a plurality of separate object portions, which are mounted on a common sample holder.

The object 10 is imaged by the charged particle microscope in a plurality of imaging scans. Each imaging scan is performed by scanning the primary electron beam in a different scanning region on the object surface, denoted with reference signs 96-1 . . . 96-59 in the imaging mode shown in FIG. 6A, and with reference signs 97-1 . . . 97-59 in the imaging mode shown in FIG. 6B. Each scanning region may be scanned in a scanning pattern of a plurality of parallel or substantially parallel scanning lines. The scanning regions may, for example, have a substantially rectangular shape.

For switching between the imaging scans, the object is displaced by the positioning system and/or the particle optical system deflects the primary beam to a start position of the subsequent imaging scan.

In the imaging mode illustrated in FIG. 6A, the scanning regions are adjacent to each other. In the imaging mode shown in FIG. 6B, the scanning regions are partially overlapping.

In each of the scanning regions, the charged particle microscope detects particle intensities and X-ray intensities when scanning the primary particle beam across the respective scanning region. The data analysis system reads the detector signals and generates, for each of the scanning regions, X-ray intensity measurement data and particle intensity measurement data.

The detected particle intensities may be intensities of backscattered electrons and/or secondary electrons. A detected particle intensity may represent a number of measured particles per unit time. The particle intensity measurement data may include, for each of the scanning regions, an image. By way of example, the image may be a BSE (backscattered electron) image and/or an SE (secondary electron) image.

The X-ray intensity measurement data may include, for each of a plurality of impingement locations of the primary beam on the object surface, an X-ray spectrum. The impingement locations on the object surface, where the X-ray spectra are acquired may be determined depending on the BSE images and/or depending on the SE images.

By way of example, the data analysis system may determine locations on the object surface, where sample particles are present, depending on the BSE images and/or dependent on the SE images. The X-ray spectra are then acquired at a plurality of impingement locations on the surfaces of the sample particles.

FIG. 2 shows a BSE image 60, acquired in one of the plurality of scanning regions 96-1 . . . 96-59, 97-1 . . . 97-59 (shown in FIGS. 6A and 6B). The BSE image 60 shows particles 64, 65, 66, which are only partially imaged in the BSE image 60. The complementary parts of these particles may be located in a scanning region, which is adjacent or overlapping with the scanning region, which is imaged by the BSE image 60 shown in FIG. 2. This is illustrated by sample particle 98 in FIGS. 6A and 6B.

The data analysis system is configured to merge the X-ray intensity measurement data for the sample particle 98 of both scanning regions 97-42, 97-43. This is described with reference to FIG. 7.

FIG. 7 shows the particle 98 and the scanning regions 97-42 and 97-43 in an enlarged mode. For each of the scanning regions, 97-42 and 97-43, X-ray intensity measurement data and particle intensity measurement data have been acquired.

Depending on at least a portion of the X-ray intensity measurement data and the particle intensity measurement data, which have been acquired in the scanning regions 97-42 and 97-43, the data analysis system generates X-ray intensity data which are assigned to a plurality of surface locations on the surface of particle 98 which are illustrated as dots in FIG. 7 (such as dots 100, 101 and 102). The assigned X-ray intensity data may include a spectrum for each of at least a part of the surface locations of the sample particle 98.

Since the X-ray intensity measurement data have been acquired at impingement locations of the primary beam in two different scanning regions 97-42 and 97-43, it is necessary to determine the positions of the impingement locations in the scanning regions 97-42 and 97-43 relative to each other.

This allows to merge the X-ray intensity measurement data of scanning region 97-42 with the X-ray intensity measurement data of scanning region 97-43 with a high positional accuracy.

A high positional accuracy results in a high accuracy of geometrical data determined by analyzing the grains which are contained in the sample particle 98. This increases the accuracy of the statistical analysis.

The data analysis system generates, depending on the particle intensity measurement data, generated from the imaging scans in each of the scanning regions 97-42 and 97-43, images for each of the scanning region. Each of the images may be BSE image and/or an SE image.

The relative positions of the impingement locations in regions 97-42 and 97-43, where the X-ray intensity measurement data have been acquired, are then determined by comparing the image of scanning region 97-42 with the image of scanning region 97-43. This allows to determine the relative position of the impingement locations of the scanning regions relative to each other with a high accuracy. Thereby, impingement locations of the scanning region 97-42 may be determined relative to impingement locations of scanning region 97-43.

Comparing the image of scanning region 97-42 with the image of scanning region 97-43 may comprise applying an image processing procedure, such as aligning and/or stitching. Depending on the comparison, a position and/or orientation of the images relative to each other may be determined.

Depending on the determined positions of the impingement locations of the primary beam relative to each other, the data analysis system generates the X-ray intensity data, which is assigned to the surface locations (such as locations 100, 101, 102) of the particle 98 with the outer boundary line 103.

Thereby, the acquired X-ray intensity measurement data of scanning regions 97-42 and 97-43 are merged with a high positional accuracy.

By way of example, the X-ray intensity data value assigned to location 100 is set to the value of an X-ray intensity measurement value, which has been acquired at an impingement location, which is substantially the same as location 100 or close to location 100. Alternatively, the X-ray intensity data value assigned to location 100 is set to an average of X-ray intensity data values, which have been acquired at impingement locations, which are located close to location 100.

Where impingement locations on the sample particle 98 of both scanning regions are identical or substantially identical (e.g. in an overlapping region), the X-ray spectra of both scanning regions may be combined. Combining two or more spectra may include summing up spectra. Accordingly, the combined spectrum is based on an increased number of counts, which increases the signal to noise ratio of the combined spectrum.

The generated X-ray intensity data which is assigned to the locations on the object surface (such as the locations illustrated by dots 100, 101, 102 in FIG. 7) of particle 98 allows to perform an analysis of the particle 98 to identify grains within the particle. The grains can be assigned to one or more of the pre-defined classes, which represent minerals or groups of minerals. Thereby, a representation of the sample particle 98 can be incorporated into the list of representations, which is displayed in rendering space 71 (shown in FIG. 3) of window 70. This allows to include the sample particle 98 into the statistical analysis of the plurality of sample particles of the object.

The data analysis system is configured to remove from the list of representations, which is shown in the rendering space 71 (shown in FIG. 3) of window 70, graphical representations of unmerged particles which are only partially imaged (such as particles 64, 65, 66) to avoid double count in the statistical analysis. Thereby, a higher reliability of the statistical analysis is achieved.

The present disclosure includes the following items:

Item 1: A method of operating a data analysis system for generating analysis data depending on microscopic data of an object generated by a charged particle microscope; wherein the microscopic data comprises an image showing a structure; wherein the data analysis system comprises a graphical user interface and a display; wherein the method comprises: displaying a graphical representation of the structure on the display by the graphical user interface; generating separation data representing at least one path of a separation cut, which separates pixels of the structure from each other; visually marking the separation cut by the graphical user interface, depending on the separation data, by differently marking different area portions of the representation, which represent different pixels of the structure which are separated from each other by the separation cut; and generating separate analysis data for each of at least two portions of the object, depending on the microscopic data and depending on the separation data.

Item 2: The method of item 1, wherein the separation data is configured such that the structure is seamlessly cut apart by the separation cut.

Item 3: The method of item 1 or 2, wherein the path of the separation cut is infinitesimally thin.

Item 4: The method of any one of items 1 to 3, wherein the marking of the separation cut is executed by the graphical user interface in time relation or in real-time relation to the generating of the separation data.

Item 5: The method of any one of items 1 to 4, further comprising: generating X-ray intensity data by detecting X-rays emitted from each of a plurality of impingement locations of a primary beam of the charged particle microscope on the object; wherein the marking of the separation further comprises visibly marking the different portions of the representation depending on the generated X-ray intensity data.

Item 6: The method of any one of items 1 to 5, further comprising: generating X-ray intensity data for each of a plurality of impingement locations of a primary beam of the charged particle microscope on the portion of the object; assigning each of the impingement locations to one of a plurality of pre-defined classes depending on the generated X-ray intensity data of the respective impingement location; wherein the marking of the separation further comprises visibly marking the pixels depending on the assigned pre-defined classes.

Item 7: The method of any one of items 1 to 6, wherein the marking of the separation further comprises displaying, by the graphical user interface, a separation indicator representing the path of the separation cut.

Item 8: The method of item 7, wherein the separation indicator has one or more position adjustable anchor points.

Item 9: The method of item 7 or 8, wherein the generating of the separation data comprises adjusting a course of the path of the separation cut by adjusting a course of the separation indicator.

Item 10: The method of any one of items 1 to 9, wherein the structure is a non-divided image region.

Item 11: A non-transitory computer-readable storage medium storing instructions that, when executed by a computer, cause the computer to perform the method of any one of items 1 to 10.

Item 12: A data analysis system for generating analysis data depending on microscopic data of an object generated by a charged particle microscope; wherein the microscopic data comprises an image showing a structure; wherein the data analysis system comprises a graphical user interface and a display; wherein the data analysis system is configured to display a graphical representation of the structure on the display by the graphical user interface; to generate separation data representing at least one path of a separation cut, which separates pixels of the structure from each other; to visually mark the separation cut by the graphical user interface, depending on the separation data, by differently marking different portions of the representation, representing different pixels of the structure which are separated from each other by the separation cut; and to generate separate analysis data for each of at least two portions of the object, depending on the microscopic data and depending on the separation data.

Item 13: A method of operating a data analysis system for analyzing microscopic data acquired by a charged particle microscope from an object comprising a plurality of sample particles; wherein the microscopic data comprises X-ray intensity measurement data and charged particle intensity measurement data, which have been acquired by scanning a primary beam of the charged particle microscope in a first and a second scanning region; wherein the first and the second scanning regions are adjacent to each other or partially overlapping with each other; wherein the method comprises: identifying at least one sample particle of the plurality of sample particles, which is at least partially located in the first and in the second scanning region; and generating X-ray intensity data assigned to surface locations of the identified sample particle depending on at least a portion of the X-ray intensity measurement data of the first scanning region, at least a portion of the X-ray intensity measurement data of the second scanning region, and further depending on at least a portion of the particle intensity measurement data.

Item 14: The method of item 13, wherein the generating of the assigned X-ray intensity data comprises: generating, for each of the first and second scanning regions, an image depending on the particle intensity measurement data of the respective scanning region; and generating the assigned X-ray intensity data depending on the images of the first and the second scanning regions.

Item 15: The method of item 14, wherein the generating the assigned X-ray intensity data comprises comparing the image of the first scanning region with the image of the second scanning region.

Item 16: The method of item 14 or 15, wherein the generating the assigned X-ray intensity data comprises applying an image processing procedure.

Item 17: The method of any one of items 14 to 16, wherein the generating the assigned X-ray intensity data comprises determining a position and/or an orientation of the image of the first scanning region relative to the image of the second scanning region.

Item 18: The method of any one of items 13 to 17, wherein the generating of the assigned X-ray intensity data comprises: determining positions of impingement locations of the primary beam in the first and in the second scanning region relative to each other; wherein at the impingement locations, the portions of the X-ray intensity measurement data of the first and second scanning regions have been acquired.

Item 19: The method of any one of items 13 to 18, wherein the generating of the assigned X-ray intensity data comprises: generating, for each of the first and second scanning regions, an image depending on the particle intensity measurement data of the respective scanning region; and determining positions of impingement locations of the primary beam in the first and in the second scanning region relative to each other; wherein at the impingement locations, the portions of the X-ray intensity measurement data of the first and second scanning regions have been acquired; wherein the determining of the impingement locations relative to each other is performed depending on the image of the first scanning region and the image of the second scanning region.

Item 20: The method of item 19, wherein the determining of the positions of the impingement locations comprises comparing the image of the first scanning region with the image of the second scanning region.

Item 21: The method of item 19 or 20, wherein the determining of the positions of the impingement locations comprises applying an image processing procedure.

Item 22: The method of any one of items 19 to 21, wherein the determining of the positions of the impingement locations comprises determining a position and/or an orientation of the image of the first scanning region relative to the image of the second scanning region.

Item 23: The method of any one of items 13 to 22, wherein the assigned X-ray intensity data comprises an X-ray spectrum.

Item 25: A non-transitory computer-readable storage medium storing instructions that, when executed by a computer, cause the computer to perform the method of any one of items 13 to 23.

Item 26: A data analysis system for analyzing microscopic data acquired by a charged particle microscope from an object comprising a plurality of sample particles; wherein the microscopic data comprises X-ray intensity measurement data and charged particle intensity measurement data, which have been acquired by scanning a primary beam of the charged particle microscope in a first and a second scanning region; wherein the first and the second scanning regions are adjacent to each other or partially overlapping with each other; wherein the data analysis system is configured to: identify at least one sample particle of the plurality of sample particles, which is at least partially located in the first and in the second scanning region; and to generate X-ray intensity data assigned to surface locations of the identified sample particle, depending on at least a portion of the X-ray intensity measurement data of the first scanning region, at least a portion of the X-ray intensity measurement data of the second scanning region, and further depending on at least a portion of the particle intensity measurement data.

Item 27: A data analysis system configured to perform the method of any one of items 1 to 10.

Item 28: A data analysis system configured to perform the method of any one of items 13 to 23.

The invention claimed is:

1. A method of analyzing a microscopic object based on microscopic data acquired by a charged particle microscope from the object, wherein the method is performed using a data analysis system, the method comprising:
   receiving X-ray intensity measurement data of the object;
   receiving the microscopic data based on charged particle intensity measurement data of the object;

wherein the X-ray intensity measurement data and the charged particle intensity measurement data have been acquired by scanning the object with a primary beam of the charged particle microscope, detecting X-rays emitted from each of a plurality of impingement locations to obtain the X-ray intensity measurement data, and detecting charged particles to obtain the charged particle intensity measurement data;

wherein the microscopic data comprises an image showing a structure, which is a non-divided image region;

wherein the data analysis system comprises a graphical user interface and a display;

wherein the method further comprises:

displaying a graphical representation of the structure on the display by the graphical user interface;

interactively generating, directed by user input, separation data representing at least one path of a separation cut, which separates pixels of the structure from each other, wherein the structure is cut by the separation cut into at least two separated structure portions;

visually marking the separation cut by the graphical user interface, depending on the separation data, by differently marking different area portions of the representation, which represent different pixels of the structure which are separated from each other by the separation cut, wherein the marking of the separation cut further comprises visibly marking, on the display, the different area portions of the representation depending on the received X-ray intensity measurement data;

changing the generated separation data; wherein the changing of the separation data comprises receiving further user input;

updating the marking of the separation cut by the graphical user interface in response to the change of the separation data;

generating separate analysis data for each of at least two portions of the object, depending on the microscopic data and depending on the separation data; and performing elemental analysis based on the generated separate analysis data and the X-ray intensity measurement data, further comprising assigning the received X-ray intensity measurement data to one of several pre-defined classes, wherein each of the classes represents a different mineral or group of minerals, wherein the differently marking of the different area portions includes displaying, on the display, the different area portions in different colors indicative of the respective class.

2. The method of claim 1, wherein the separation data is configured such that the structure is seamlessly cut apart by the separation cut.

3. The method of claim 1, wherein the path of the separation cut is infinitesimally thin.

4. The method of claim 1, wherein the marking of the separation cut is executed by the graphical user interface in real-time relation or substantially in real-time relation to the generating of the separation data.

5. The method of claim 1, wherein the marking of the separation cut further comprises displaying, by the graphical user interface, a separation indicator representing the path of the separation cut.

6. The method of claim 5, wherein the separation indicator has one or more position adjustable anchor points.

7. The method of claim 5, wherein the generating of the separation data comprises adjusting a course of the path of the separation cut by adjusting a course of the separation indicator.

8. A non-transitory computer-readable storage medium storing instructions that, when executed by a computer, cause the computer to perform a method of analyzing a microscopic object based on microscopic data acquired by a charged particle microscope from the object, the method comprising:

receiving X-ray intensity measurement data of the object;

receiving the microscopic data based on charged particle intensity measurement data of the object, wherein the X-ray intensity measurement data and the charged particle intensity measurement data have been acquired by scanning the object with a primary beam of the charged particle microscope, detecting X-rays emitted from each of a plurality of impingement locations to obtain the X-ray intensity data, and detecting charged particles to obtain the charged particle intensity measurement data;

wherein the microscope data comprises an image showing a structure, which is a non-divided image region;

wherein the data analysis system comprises a graphical user interface and a display;

wherein the method further comprises:

displaying a graphical representation of the structure on the display by the graphical user interface;

interactively generating, directed by user input, separation data representing at least one path of a separation cut, which separates pixels of the structure from each other, wherein the structure is cut by the separation cut into at least two separated structure portions; visually marking the separation cut by the graphical user interface, depending on the separation data, by differently marking different area portions of the representation, which represent different pixels of the structure which are separated from each other by the separation cut, wherein the marking of the separation cut further comprises visibly marking, on the display, the different portions of the representation depending on the received X-ray intensity measurement data;

changing the generated separation data; wherein the changing of the separation data comprises receiving further user input;

updating the marking of the separation cut by the graphical user interface in response to the change of the separation data;

generating separate analysis data for each of at least two portions of the object, depending on the microscopic data and depending on the separation data; and performing elemental analysis based on the generated separate analysis data and the X-ray intensity measurement data, further comprising assigning the received X-ray intensity measurement data to one of several pre-defined classes, wherein each of the classes represents a different mineral or group of minerals, wherein the differently marking of the different area portions includes displaying, on the display, the different area portions in different colors indicative of the respective class.

9. A data analysis system for analyzing a microscopic object based on microscopic data acquired by a charged particle microscope from the object, the data analysis system configured to:
- receive X-ray intensity measurement data of the object;
- receive the microscopic data based on charged particle intensity measurement data of the object,
- wherein the X-ray intensity measurement data and the charged particle intensity measurement data have been acquired by scanning the object with a primary beam of the charged particle microscope, detecting X-rays emitted from each of a plurality of impingement locations to obtain the X-ray intensity measurement data, and detecting charged particles to obtain the charged particle intensity measurement data;
- wherein the microscopic data comprises an image showing a structure, which is a non-divided image region;
- wherein the data analysis system comprises a graphical user interface and a display;
- wherein the data analysis system is further configured to:
  - display a graphical representation of the structure on the display by the graphical user interface;
  - interactively generate, directed by user input, separation data representing at least one path of a separation cut, which separates pixels of the structure from each other, wherein the structure is cut by the separation cut into at least two separated structure portions; visually mark the separation cut by the graphical user interface, depending on the separation data, by differently marking different portions of the representation, representing different pixels of the structure which are separated from each other by the separation cut, wherein the marking of the separation cut further comprises visibly marking, on the display, the different portions of the representation depending on the received X-ray intensity measurement data;
  - change the generated separation data; wherein the changing of the separation data comprises receiving further user input;
  - update the marking of the separation cut by the graphical user interface in response to the change of the separation data;
  - generate separate analysis data for each of at least two portions of the object, depending on the microscopic data and depending on the separation data; and
  - perform elemental analysis based on the generated separate analysis data and the X-ray intensity measurement data,
- further comprising assigning the received X-ray intensity measurement data to one of several pre-defined classes, wherein each of the classes represents a different mineral or group of minerals,
- wherein the differently marking of the different area portions includes displaying, on the display, the different area portions in different colors indicative of the respective class.

* * * * *